United States Patent
Barsun et al.

(10) Patent No.: US 7,434,743 B2
(45) Date of Patent: Oct. 14, 2008

(54) REVERSIBLE FAN OF ELECTRONIC MODULE

(75) Inventors: Stephan Karl Barsun, Sacramento, CA (US); Jeff Evans, Meadow Vista, CA (US); Glenn C. Simon, Auburn, CA (US); Robert William Dobbs, Granite Bay, CA (US); Andrew Michael Cherniski, Rescue, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 665 days.

(21) Appl. No.: 11/045,249

(22) Filed: Jan. 28, 2005

(65) Prior Publication Data

US 2006/0169789 A1 Aug. 3, 2006

(51) Int. Cl.
*F24F 7/00* (2006.01)
*H05K 7/20* (2006.01)
*F28F 7/00* (2006.01)

(52) U.S. Cl. ............... 236/49.3; 361/697; 165/80.3

(58) Field of Classification Search ............ 165/121, 165/80.3, 185, 120; 236/49.3; 361/697, 361/704; 415/68, 209.1, 193
See application file for complete search history.

(56) References Cited

U.S. PATENT DOCUMENTS

| | | |
|---|---|---|
| 3,935,522 A | 1/1976 | Tsay |
| 4,373,576 A | 2/1983 | Strupczewski |
| 4,702,154 A | 10/1987 | Dodson |
| 5,249,741 A | 10/1993 | Bistline et al. |
| 5,576,931 A | 11/1996 | Crane, Jr. et al. |
| 5,831,847 A | 11/1998 | Love |
| 5,949,646 A * | 9/1999 | Lee et al. ............ 361/695 |
| 6,265,790 B1 | 7/2001 | Vogman |
| 6,349,385 B1 | 2/2002 | Kaminski et al. |
| 6,735,081 B1 * | 5/2004 | Bishop et al. ............ 361/695 |
| 6,778,386 B2 | 8/2004 | Garnett et al. |
| 6,791,209 B2 | 9/2004 | Aldridge et al. |
| 6,829,141 B2 | 12/2004 | Garnett et al. |
| 2004/0201957 A1 | 10/2004 | Wu et al. |
| 2004/0257767 A1 | 12/2004 | Wang |

FOREIGN PATENT DOCUMENTS

| | | | |
|---|---|---|---|
| EP | 284709 A2 * | 10/1988 | |
| JP | 06307659 A | 1/1994 | |
| JP | 2003037385 A | 2/2003 | |

* cited by examiner

Primary Examiner—Chen-Wen Jiang

(57) ABSTRACT

An apparatus in one example comprises a reversible fan of an electronic module that rotates in a clockwise direction if the electronic module is communicatively coupled in a first position and a counterclockwise direction if the electronic module is communicatively coupled in a second position.

36 Claims, 3 Drawing Sheets

REVERSIBLE FAN OF ELECTRONIC MODULE

BACKGROUND

Computing systems utilize electronic components that generate a substantial amount of heat during operation. Cooling systems of various types are employed to maintain the temperature of the electronic components and the environment of the electronic components within an acceptable operating temperature range. For example, an electronic module may employ a fan to create a cooling airflow across the electronic components within the electronic module.

One design employs a fan located at one end of the electronic module. The fan forces cooling airflow across the electronic components before exiting at the other end of the electronic module. The fan may be optimized for airflow in a single direction. For example, the blades of the fan may be curved for airflow in the direction from the end of the electronic module that houses the fan to the other end of the electronic module.

SUMMARY

The invention in one implementation encompasses a system. The system comprises a reversible fan of a subsystem that rotates in a clockwise direction if the subsystem is communicatively coupled into a first position in the system and a counterclockwise direction if the subsystem is communicatively coupled into a second position in the system.

Another implementation of the invention encompasses an apparatus. The apparatus comprises a reversible fan of an electronic module that rotates in a clockwise direction if the electronic module is communicatively coupled in a first position and a counterclockwise direction if the electronic module is communicatively coupled in a second position.

Yet another implementation of the invention encompasses a method. It is determined whether an electronic module is communicatively coupled in a first position or a second position. The electronic module comprises a reversible fan. A rotation direction of the reversible fan is set based on whether the electronic module is in the first position or the second position.

Still yet another implementation of the invention encompasses an apparatus. The apparatus comprises means for receiving an electronic module on a first side of a midplane board and a second electronic module on a second side of the midplane board. The first electronic module comprises a first fan and the second electronic module comprises a second fan. A rotational direction of the second fan is reversible. The apparatus further comprises means for setting the rotational direction of the second fan to be opposite a rotational direction of the first fan so airflow through the second fan is in a same direction as airflow through the first fan.

DESCRIPTION OF THE DRAWINGS

Features of exemplary implementations of the invention will become apparent from the description, the claims, and the accompanying drawings in which:

DETAILED DESCRIPTION

Referring to the BACKGROUND section above, the fan of the electronic module creates airflow in the same direction regardless of the position of the electronic module in the computing system. For example, the fan has a rotation direction that produces airflow from the end of the electronic module that houses the fan to the other end of the electronic module. A need may exist for two electronic modules with cooling fans in the computing system. For example, the computing system may employ two power supply modules with cooling fans. The first electronic module may be coupled into the computing system on a first side of a midplane board. The second electronic module may be coupled into the computing system on a second side of the midplane board. One known design of the electronic module has the fan near one end of the electronic module forcing air towards the other end. When the two electronic modules are coupled into the system at the midplane, the two fans will force air in opposite directions. In one example, the two fans would force air towards each other into the middle of the computing system and the air would not have an exit path. In another example, the two fans would force air away from each other out of the system in opposite directions and the computing system may not be sufficiently cooled. As one shortcoming, the electronic modules are unable to reverse the airflow direction of the fans to align the airflow from both fans into a same direction. Thus, a need exists for a fan controller that sets the rotation direction of the fan based on a position of the electronic module in the computing system.

Figure 1:
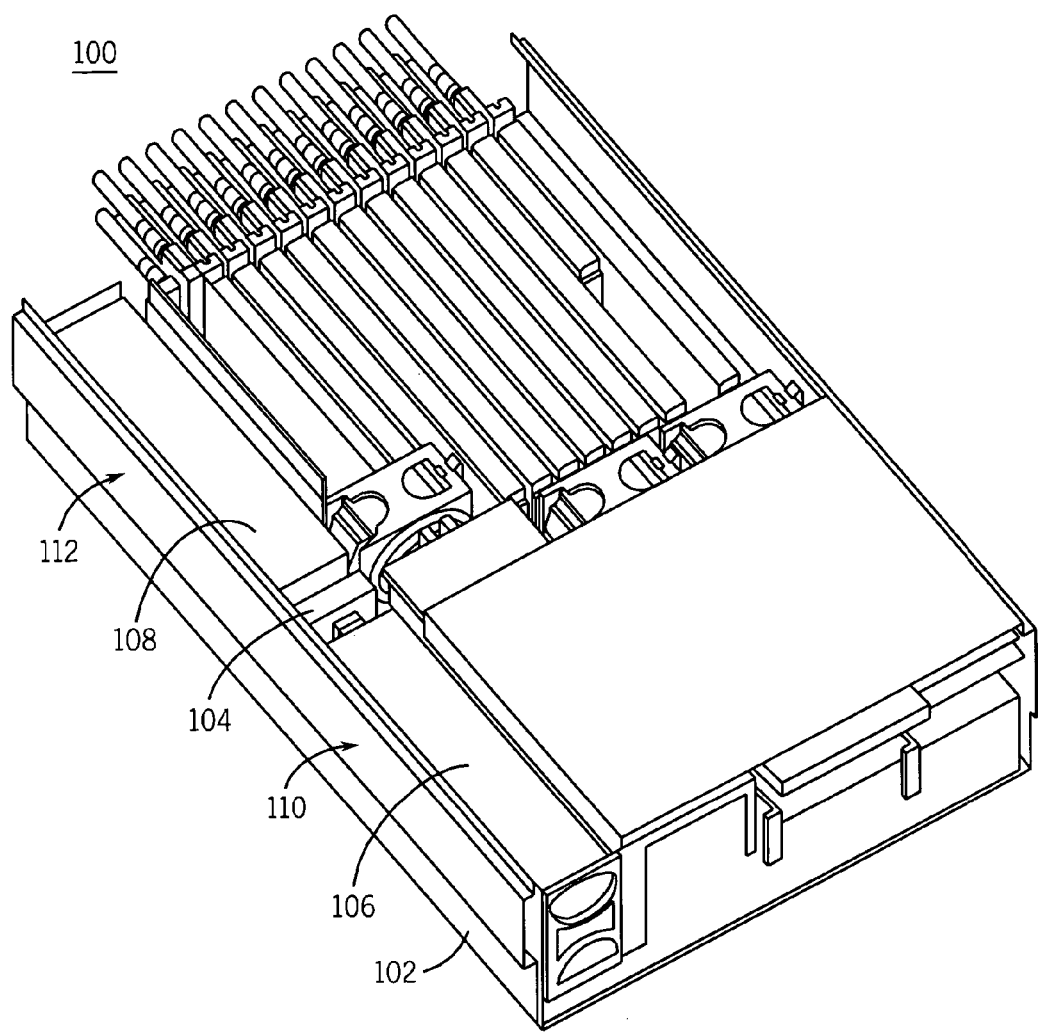
FIG. 1 is a representation of one implementation of an apparatus that comprises a computer chassis, a midplane board, and one or more electronic modules.

Turning to FIG. 1, an apparatus 100 comprises a computer chassis 102, a midplane board 104, and one or more electronic modules 106 and 108. The apparatus 100 in one example comprises a system, such as a computing system. The system comprises a plurality of subsystems, such as the electronic modules 106 and 108. To communicatively couple the electronic module 106 into a first position 110 in the system, the electronic module 106 is inserted into the computer chassis 102 from a first direction (e.g., from the front of the computer chassis 102). To communicatively couple the electronic module 108 into a second position 112 in the system, the electronic module 108 is inserted into the computer chassis 102 from a second direction (e.g., from the back of the computer chassis 102). Where the electronic modules 106 and 108 comprise power supply modules, the midplane board 104 distributes alternating current power to the power supply modules. The power supply modules then return direct current power back to the midplane board 104 for use in other electronics within the system. The alternating current input power and the direct current output power of the power supply modules are distributed between the midplane board 104 and the power supply modules via blind mate electrical connectors.

In one example, the two electronic modules 106 and 108 are different. For example, the electronic module 106 may comprise a power supply module and the electronic module 108 may comprise a memory module. In another example, the electronic modules 106 and 108 are substantially identical. For example, the electronic modules 106 and 108 both may comprise power supply modules with substantially identical external connections. The electronic modules 106 and 108 in one example are interchangeable. For example, either of the electronic modules 106 and 108 may be inserted into the computer chassis 102 into the first position 110 and either of the electronic modules 106 and 108 may be inserted into the computer chassis 102 into the second position 112.

Figure 2:
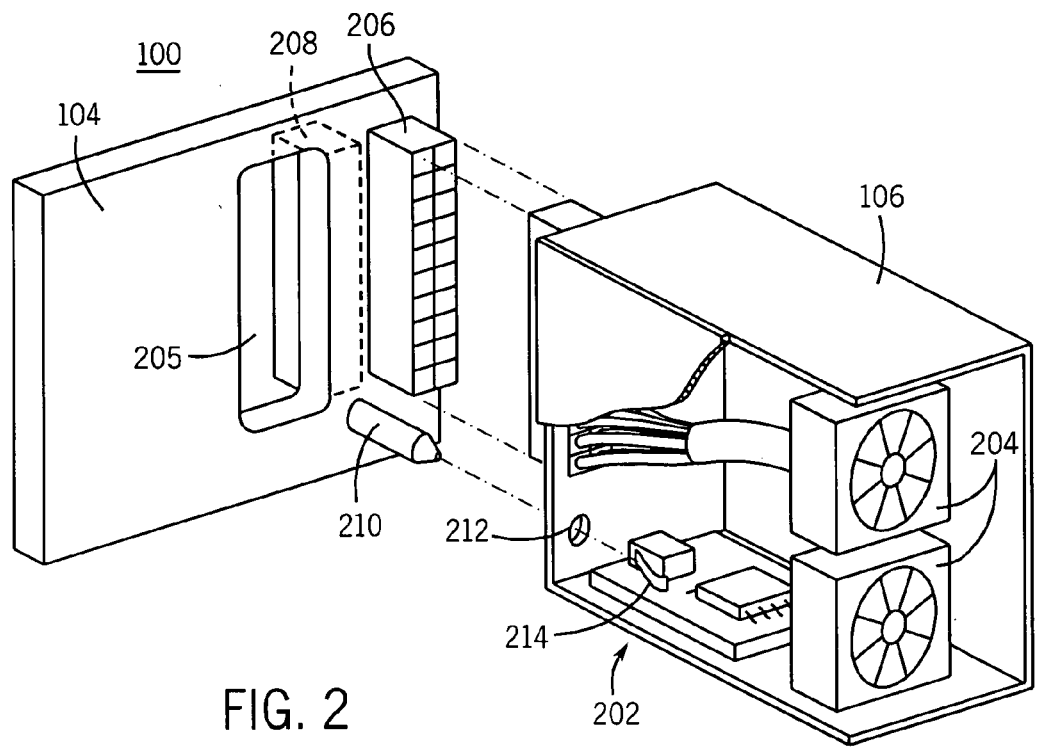
FIG. 2 is a representation of an exemplary connection between the midplane board and an electronic module of the one or more electronic modules of the apparatus of FIG. 1.

Referring to FIGS. 1-2, the electronic module 106 comprises a fan controller 202 and one or more reversible fans 204. The electronic module 108 comprises a fan controller (not shown) and one or more reversible fans (not shown) that are analogous and/or identical to the fan controller 202 and the reversible fans 204 of the electronic module 106. For example, the fan positions within the electronic modules 106 and 108 are substantially similar. The reversible fan 204 may be internal or external to the electronic module 106. For example, the reversible fan 204 may be housed within a chassis of the electronic module 106 or attached to an outer surface of the chassis of the electronic module 106.

Since the electronic module 106 is inserted from the front of the computer chassis 102 and the electronic module 108 is inserted from the back of the computer chassis 102, the electronic modules 106 and 108 are oriented in opposite directions. Therefore, the fan controller 202 and the fan controller of the electronic module 108 set opposite rotation directions for the reversible fan 204 and the reversible fan of the electronic module 108 to move air in a same airflow direction.

In one example, the electronic modules 106 and 108 are slightly offset so that each of the electronic modules 106 and 108 have a unique airflow path. In another example, the electronic modules 106 and 108 are in a same airflow path. The computer chassis 102 may not have available space for a side-by-side configuration of the electronic modules 106 and 108 where the fans of the electronic modules 106 and 108 could rotate in a same direction to produce airflow in a same direction. Therefore, the electronic modules 106 and 108 may be in series on one side of the computer chassis 102 where the fans of the electronic modules 106 and 108 rotate in opposite directions to produce airflow in the same direction.

Airflow from a first one of the electronic modules 106 and 108 flows through or around a second one of the electronic modules 106 and 108 in the same airflow direction as airflow generated by the second one of the electronic modules 106 and 108. For example, if it is desired for the airflow to travel from the front of the computer chassis 102 to the back of the computer chassis 102, the reversible fan 204 creates airflow that flows through or around the reversible fan of the electronic module 108 in the same airflow direction as the airflow created by the reversible fan of the electronic module 108. Where the reversible fans are located at the non-connection end of the electronic modules 106 and 108, the reversible fan 204 pushes air through the electronic module 106 toward the electronic module 108 and the reversible fan of the electronic module 108 pulls air through the electronic module 108 toward the exit path. Both the airflows from the reversible fan 204 and the reversible fan of the electronic module 108 exit out of the back of the computer chassis 102.

Where it is desired for the airflow to travel from the front of the computer chassis 102 to the back of the computer chassis 102, then the fan controller 202 drives the reversible fan 204 in a first rotation direction to force air towards the reversible fan of the electronic module 108. The fan controller of the electronic module 108 drives the reversible fan of the electronic module 108 in a second rotation direction, opposite the first rotation direction, to force air towards an exit path in the back of the computer chassis 102. The midplane board 104 in one example comprises an opening 205 that allows passage of airflow between the electronic modules 106 and 108.

The fan controller 202 sets the rotation direction of the reversible fan 204 based on whether the electronic module 106 is in the first position 110 on a first side of the midplane board 104 or the second position 112 on a second side of the midplane board 104. The midplane board 104 in one example comprises a connector 206 on a first face of the midplane board 104, a connector 208 on a second face of the midplane board 104, and a pin 210 that extends from one face (e.g., the first face that supports the connector 206) of the midplane board 104. The other face (e.g., the second face that supports the connector 208) of the midplane board 104 does not have a pin analogous to the pin 210. The pin 210 serves to differentiate the one face of the midplane board 104 from the other face of the midplane board 104.

The electronic module 106 comprises a hole 212 that aligns with the pin 210 upon connection of the electronic module 106 with the connector 206. If the electronic module 106 connects to the one face of the midplane board 104 with the pin 210, the hole 212 receives the pin 210 and the pin 212 closes a switch 214 within the electronic module 106. If the electronic module 106 connects the other face of the midplane board 104 that does not have a pin analogous to the pin 210, the switch 214 within the electronic module 106 is left open. The fan controller 202 employs the switch 214 to indicate whether the electronic module 106 is in the first position 110 on the first side of the midplane board 104 or the second position 112 on the second side of the midplane board 104. For example, the fan controller 202 employs the switch 214 to determine whether to drive the reversible fan 204 in the clockwise or counterclockwise direction. If the switch 214 is closed, the fan controller 202 drives the reversible fan 204 in a first one of the clockwise and counterclockwise directions. If the switch 214 is open, the fan controller 202 drives the reversible fan 204 in a second one of the clockwise and counterclockwise directions.

In another example, a light beam sensor indicates to the fan controller 202 whether the electronic module 106 is in the first position 110 or the second position 112. For example, the pin 210 serves as an optical interrupter. If the electronic module 106 connects to the one face of the midplane board 104 with the optical interrupter, the optical interrupter interacts with the light beam sensor and activates an optical switch. For example, the optical interrupter blocks a light beam from reaching the light beam sensor. If the electronic module 106 connects the other face of the midplane board 104 that does not have the optical interrupter, then the light beam is not blocked from reaching the light beam sensor and the optical switch is not activated. If the optical switch is activated, the fan controller 202 drives the reversible fan 204 in a first one of the clockwise and counterclockwise directions. If the optical switch is not activated, the fan controller 202 drives the reversible fan 204 in a second one of the clockwise and counterclockwise directions.

In yet another example, a jumper between two pins of the connector 206 indicates to the fan controller 202 whether the electronic module 106 is in the first position 110 or the second position 112. The jumper electrically connects two pins in the connector 206 on one face of the midplane board 104. The connector 208 on the other face of the midplane board 104 does not have a jumper between the same two pins as in the connector 206. If the electronic module 106 connects to the connector 206 with the jumper, the jumper closes a circuit in the electronic module 106 that indicates to the fan controller 202 that the electronic module 106 is on the side of the midplane board 104 with the jumper. If the electronic module 106 connects to the connector 208 on the other side of the midplane board 104 without the jumper, the circuit in the electronic module 106 remains open which indicates to the fan controller 202 that the electronic module 106 is on the side of the midplane board 104 without the jumper. The fan controller 202 employs the state of the circuit (i.e., open or closed) to determine whether to rotate the reversible fan 204 in the clockwise direction or the counterclockwise direction.

Figure 3:
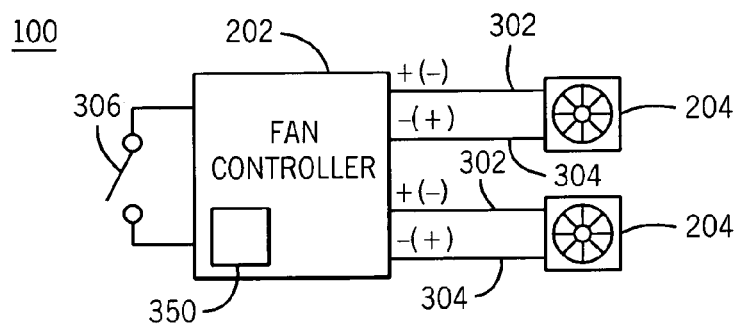
FIG. 3 is a representation of one exemplary fan controller for the reversible fans of the one or more electronic modules of the apparatus of FIG. 1.

Referring to FIGS. 1-3, in one example, the fan controller 202 comprises two output lines 302 and 304 to the reversible fan 204 to control a rotation direction of the reversible fan 204. The two output lines 302 and 304 comprise input lines into the reversible fan 204. One of the two output lines 302 and 304 is set to be electrically high and the other one is set to be electrically low. The reversible fan 204 rotates either clockwise or counterclockwise depending on which of the two output lines 302 and 304 is electrically high. The fan controller 202 changes the rotation direction of the reversible fan 204 by changing the polarity of the two output lines 302.

If the electronic module 106 is in the first position 110, the fan controller 202 sets the first output line 302 to be electrically high and the second output line 304 to be electrically low. If the electronic module 106 is in the second position 112, the fan controller 202 sets the first output line 302 to be electrically low and the second output line 304 to be electrically high. In one example, the fan controller 202 drives the reversible fan 204 in the clockwise direction when the electronic module 106 is in the first position 110 and in the counterclockwise direction when the electronic module 106 is in the second position 112. In another example, the fan controller 202 drives the reversible fan 204 in the counterclockwise direction when the electronic module 106 is in the first position 110 and in the clockwise direction when the electronic module 106 is in the second position 112.

Figure 4:
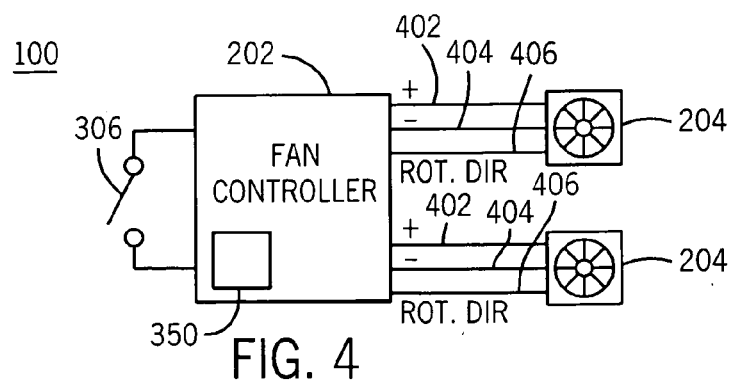
FIG. 4 is a representation of another exemplary fan controller for the reversible fans of the one or more electronic modules of the apparatus of FIG. 1.
Figure 5:
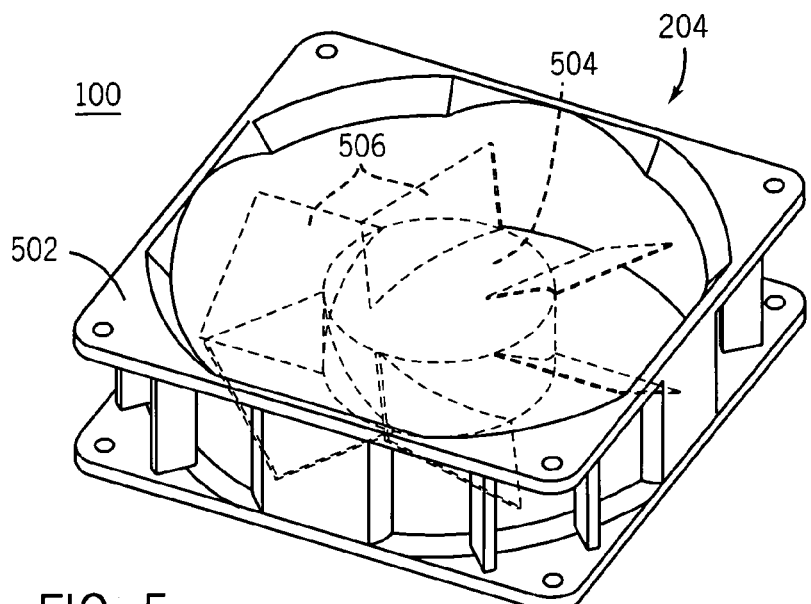
FIG. 5 is a representation of a reversible fan of the one or more electronic modules of the apparatus of FIG. 1.

Referring to FIGS. 1-2 and 4, in another example, the reversible fan 204 comprises two power lines 402 and 404 and the fan controller 202 comprises a direction control output line 406 to the reversible fan 204 to control a rotation direction of the reversible fan 204. One of the two power lines 402 and 404 is electrically high and the other is electrically low to power the reversible fan 204. The direction control output line 406 comprises a direction control input line into the reversible fan 204. The fan controller 202 sends a rotation direction control signal over the direction control output line 406 to the reversible fan 204 to set a rotation direction of the reversible fan 204. In one example, the fan controller 202 sets the direction control output line 406 electrically high to drive the reversible fan 204 in the clockwise direction and electrically low to drive the reversible fan 204 in the counterclockwise direction. In another example, the fan controller 202 makes the direction control output line 406 electrically high to drive the reversible fan 204 in the counterclockwise direction and electrically low to drive the reversible fan 204 in the clockwise direction.

Referring to FIGS. 1 and 3-4, the fan controller 202 sets a rotation direction of the reversible fan 204 of the electronic module 106 based on whether the electronic module 106 is in the first position 110 or the second position 112. The fan controller 202 in one example employs a switch 306 to detect whether the electronic module 106 is in the first position 110 or the second position 112. The switch 306 may comprise a microswitch, a light sensor, or a jumper in a connector in the midplane 104. In one example, the switch 306 is closed if the electronic module 106 is in the first position 110 and the switch 306 is open if the electronic module 106 is in the second position 112. In another example, the switch 306 is closed if the electronic module 106 is in the second position 112 and the switch 306 is open if the electronic module 106 is in the first position 110. The fan controller 202 sets the rotation control lines (e.g., the output lines 302 and 304 or the direction control output line 406) based on whether the switch 306 is open or closed.

Referring to FIGS. 5-8, the reversible fan 204 comprises a reversible motor, a frame 502, a hub 504, and one or more fan blades 506. The frame 502 couples the reversible fan 204 into the electronic module 106 (FIG. 2). The hub 504 can rotate in both clockwise and counterclockwise directions. The fan blades 506 extend from the hub 504.

The fan blades 506 are positioned on the hub 504 to achieve substantially similar airflow characteristics in opposite airflow directions for both the clockwise and counterclockwise directions of rotation. If the hub 504 rotates in the clockwise direction, the reversible fan 204 creates a first airflow in a first direction 602. If the hub 504 rotates in the counterclockwise direction, the reversible fan 204 creates a second airflow in a second direction 604 that is opposite the first direction 602. The volume and speed of the first and second airflows are substantially similar to promote similar cooling in either rotation direction of the reversible fan 204.

The fan blades 506 are substantially symmetric for rotation in both the clockwise and counterclockwise directions. For example, the surfaces of the fan blades 506 that act on the air in the clockwise rotation direction are substantially similar to the surfaces of the fan blades 506 that act on the air in the counterclockwise rotation direction.

Figure 6:
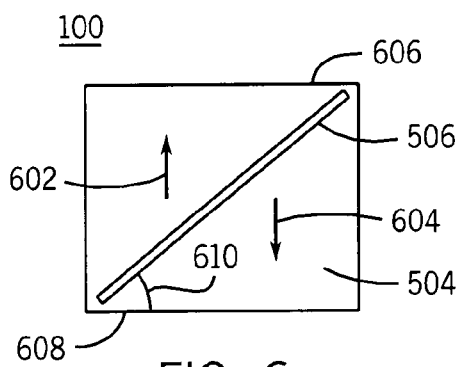
FIG. 6 is a representation of one exemplary fan blade design for the reversible fan of the apparatus of FIG. 5.
Figure 7:
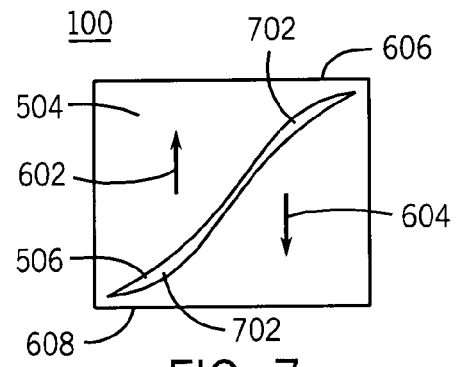
FIG. 7 is a representation of another exemplary fan blade design for the reversible fan of the apparatus of FIG. 5.

Referring to FIGS. 6-7, the fan blades 506 are rigid. For example, the fan blades are formed from metal, plastic, or the like. The fan blades 506 in one example diagonally extend from a first end portion 606 of the hub 504 to a second end portion 608 of the hub 504. In one example, the fan blades 506 comprise flat blades (FIG. 6) aligned at an angle 610 of substantially forty-five degrees. In another example, the fan blades 506 comprise curved blades (FIG. 7) with one or more curved portions 702 that promote an increased airflow upon rotation.

Figure 8:
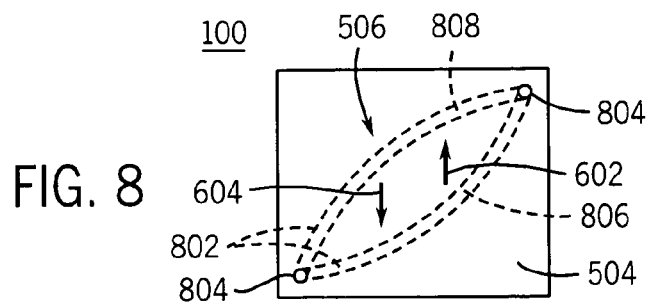
FIG. 8 is a representation of yet another exemplary fan blade design for the reversible fan of the apparatus of FIG. 5.

Referring to FIG. 8, the fan blades 506 are flexible. For example, the fan blade 506 comprises a flexible blade portion 802 and a blade support component 804 at each end of the flexible blade portion 802. The blade support components 804 hold the ends of the flexible blade portion 802 in place while the middle of the flexible blade portion 802 is able to bend into curved positions to achieve better airflow characteristics. Upon rotation of the hub 504 in the clockwise direction, the flexible blade portion 802 bends into a first curved position 806 to promote an increased airflow in the first direction 602. Upon rotation of the hub 504 in the counterclockwise direction, the flexible blade portion bends into a second curved position 808 to promote an increased airflow in the second direction 604 opposite the first direction 602.

The apparatus 100 in one example comprises a plurality of components such as one or more of electronic components, hardware components, and computer software components. A number of such components can be combined or divided in the apparatus 100. An exemplary component of the apparatus 100 employs and/or comprises a set and/or series of computer instructions written in or implemented with any of a number of programming languages, as will be appreciated by those skilled in the art. The apparatus 100 in one example comprises any (e.g., horizontal, oblique, or vertical) orientation, with the description and figures herein illustrating one exemplary orientation of the apparatus 100, for explanatory purposes.

The apparatus 100 in one example employs one or more computer-readable signal-bearing media. The computer-readable signal-bearing media store software, firmware and/or assembly language for performing one or more portions of one or more embodiments of the invention. Examples of a computer-readable signal-bearing medium for the apparatus 100 comprise the recordable data storage medium 350 of the fan controller 202. The computer-readable signal-bearing medium for the apparatus 100 in one example comprise one or more of a magnetic, electrical, optical, biological, and atomic data storage medium. For example, the computer-readable signal-bearing medium comprise floppy disks, magnetic tapes, CD-ROMs, DVD-ROMs, hard disk drives, and electronic memory. In another example, the computer-readable signal-bearing medium comprises a modulated carrier signal transmitted over a network comprising or coupled with the apparatus 100, for instance, one or more of a telephone network, a local area network ("LAN"), a wide area network ("WAN"), the Internet, and a wireless network.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A system, comprising:
a first reversible power supply fan of a first power supply module that rotates in a clockwise direction if the first power supply module is communicatively coupled into a first position in the system and a counterclockwise direction if the first power supply module is communicatively coupled into a second position in the system;
a midplane board; and
a second reversible power supply fan of a second power supply module;
wherein the first power supply module is communicatively coupled with the midplane board in the first position, wherein the second power supply module is communicatively coupled with the midplane board in the second position.

2. The system of claim 1, wherein upon determination that the first power supply module is in the first position, the first reversible power supply fan rotates in the clockwise direction; wherein upon determination that the second power supply module is in the second position, the second reversible power supply fan rotates in the counterclockwise direction.

3. The system of claim 1, wherein the first power supply module comprises one of a plurality of subsystems of the system.

4. An apparatus, comprising:
a first reversible power supply fan of a first power supply module that rotates in a clockwise direction if the power supply module is communicatively coupled in a first position and a counterclockwise direction if the first power supply module is communicatively coupled in a second position; and
a second reversible power supply fan of a second power supply module;
wherein the first power supply module is communicatively coupled with a midplane board in the first position, wherein the second power supply module is communicatively coupled with the midplane board in the second position.

5. The apparatus of claim 4, wherein the first power supply module is communicatively coupled with the midplane board in the first position or the second position.

6. The apparatus of claim 5, wherein the first position is located on a first side of the midplane board, wherein the second position is located on a second side of the midplane board.

7. The apparatus of claim 4, wherein the first reversible power supply fan comprises one or more fan blades;
wherein the one or more fan blades are positioned to achieve substantially similar airflow characteristics in opposite airflow directions for both the clockwise and counterclockwise directions of rotation.

8. The apparatus of claim 7, wherein the one or more fan blades are rigid and substantially symmetric for rotation in both the clockwise and counterclockwise directions.

9. The apparatus of claim 8, wherein the first reversible power supply fan comprises a hub and the one or more fan blades, wherein the one or more fan blades comprise flat blades that diagonally extend from a first end portion of the hub to a second end portion of the hub.

10. The apparatus of claim 8, wherein the first reversible power supply fan comprises a hub and the one or more fan blades, wherein the one or more fan blades diagonally extend from a first end portion of the hub to a second end portion of the hub, wherein the one or more fan blades comprise one or more curved portions that promote an increased airflow upon rotation.

11. The apparatus of claim 7, wherein the one or more fan blades comprise a fan blade with a flexible blade portion and a blade support component at each end of the flexible blade portion;
wherein upon rotation of the first reversible power supply fan in the clockwise direction, the flexible blade portion bends into a first curved position to promote an increased airflow in a first direction;
wherein upon rotation of the first reversible power supply fan in the counterclockwise direction, the flexible blade portion bends into a second curved position to promote an increased airflow in a second direction opposite the first direction.

12. The apparatus of claim 4, wherein upon determination that the first power supply module is in the first position, the first reversible power supply fan rotates in the clockwise direction;
wherein upon determination that the second power supply module is in the second position, the second reversible power supply fan rotates in the counterclockwise direction.

13. The apparatus of claim 12, wherein airflow from a first one of the first and second reversible power supply fans flows through a second one of the first and second reversible power supply fans in a same airflow direction as airflow generated by the second one of the first and second reversible power supply fans.

14. An apparatus, comprising:
a fan controller that drives a reversible fan of an electronic module in a clockwise direction if the electronic module is communicatively coupled in a first position and a counterclockwise direction if the electronic module is communicatively coupled in a second position;
wherein the electronic module is communicatively coupled with a midplane board in the first position or the second position;
wherein the first position is located on a first side of the midplane board, wherein the second position is located on a second side of the midplane board;
wherein a first end portion of the electronic module connects with either a first face of the midplane board in the first position or a second face of the midplane board in the second position;
wherein the fan controller determines whether the electronic module is connected to the first face or the second face of the midplane board to determine whether to drive the reversible fan in the clockwise direction or the counterclockwise direction.

15. The apparatus of claim 14, wherein the electronic module comprises a power supply module, wherein the reversible fan comprises a reversible power supply fan.

16. The apparatus of claim 15, wherein the fan controller comprises a first fan controller, wherein the power supply module comprises a first power supply module, wherein the reversible power supply fan comprises a first reversible power supply fan, the apparatus further comprising a second fan controller that drives a second reversible power supply fan of a second power supply module;
wherein the first power supply module is communicatively coupled with the midplane board in the first position, wherein the second power supply module is communicatively coupled with the midplane board in the second position.

17. The apparatus of claim 16, wherein the first fan controller determines that the first power supply module is in the first position and drives the first reversible power supply fan in the clockwise direction;
wherein the second fan controller determines that the second power supply module is in the second position and drives the second reversible power supply fan in the counterclockwise direction.

18. The apparatus of claim 17, wherein the first and second fan controllers set opposite rotation directions for the first and second reversible power supply fans to move air in a same airflow direction through the first and second reversible power supply fans.

19. The apparatus of claim 14, wherein the fan controller comprises a direction control output line to the reversible fan, wherein the fan controller sends a rotation direction control signal over the direction control output line to the reversible fan to set a rotation direction of the reversible fan.

20. The apparatus of claim 14, wherein the fan controller comprises two output lines to the reversible fan to control a rotation direction of the reversible fan;
wherein if the electronic module is in the first position, the fan controller sets a first line of the two output lines to be electrically high and a second line of the two output lines to be electrically low to drive the reversible fan in the clockwise direction;
wherein if the electronic module is in the second position, the fan controller sets the first line to be electrically low and the second line to be electrically high to drive the reversible fan in the counterclockwise direction.

21. The apparatus of claim 14, in combination with the electronic module and the midplane board;
wherein the midplane board comprises a pin that extends from one face of the midplane board, wherein the electronic module comprises a hole that aligns with the pin;
wherein if the electronic module connects to the one face of the midplane board with the pin, the hole receives the pin and the pin closes a switch within the electronic module;
wherein if the electronic module connects to another face of the midplane board without the pin, the switch within the electronic module is open;
wherein if the switch is closed, the fan controller drives the reversible fan in a first one of the clockwise and counterclockwise directions;
wherein if the switch is open, the fan controller drives the reversible fan in a second one of the clockwise and counterclockwise directions.

22. The apparatus of claim 14, in combination with the electronic module and the midplane board;
wherein the midplane board comprises optical interrupter on one face of the midplane board, wherein the electronic module comprises a light beam sensor;
wherein if the electronic module connects to the one face of the midplane board with the optical interrupter, the optical interrupter interacts with the light beam sensor and activates an optical switch;
wherein if the electronic module connects to another face of the midplane board without the optical interrupter, the optical switch is not activated;
wherein if the optical switch is activated, the fan controller drives the reversible fan in a first one of the clockwise and counterclockwise directions;
wherein if the optical switch is not activated, the fan controller drives the reversible fan in a second one of the clockwise and counterclockwise directions.

23. The apparatus of claim 14, in combination with the electronic module and the midplane board;
wherein the midplane board comprises a first connector on a first face of the midplane board, wherein the first connector on the first face comprises a jumper that electrically connects two pins of the first connector;
wherein upon connection of the electronic module to the first connector on the first face of the midplane board, the jumper closes a circuit in the electronic module;
wherein upon determination that the circuit is closed, the fan controller determines that the electronic module is coupled with the first face of the midplane.

24. An apparatus, comprising:
a first power supply module connected with a first side of a midplane board, wherein the first power supply module comprises a first reversible fan; and
a second power supply module connected with a second side of the midplane board, wherein the second power supply module comprises a second reversible fan;
wherein upon determination that the first power supply module is on the first side of the midplane board, the first reversible fan spins in a clockwise direction;
wherein upon determination that the second supply is on the second side of the midplane board, the second reversible fan spins in a counterclockwise direction to move air in a same direction as the first reversible fan.

25. The apparatus of claim 24, wherein external connections of the first and second power supply modules are substantially identical.

26. The apparatus of claim 24, wherein the first power supply module is connectable with either of the first and second sides of the midplane board, wherein the second power supply module is connectable with either of the first and second sides of the midplane board;

wherein if the first power supply module is connected with the second side of the midplane board, the first reversible fan spins in the counterclockwise direction;

wherein if the second power supply module is connected with the first side of the midplane board, the second reversible fan spins in the clockwise direction to move air in the same direction as the first reversible fan.

27. The apparatus of claim 24, wherein the first power supply module comprises a fan controller that determines whether the first power supply module is communicatively coupled with the first side or the second side of the midplane board;

wherein the fan controller comprises a direction control output line to the first reversible fan, wherein the fan controller sends a rotation direction control signal over the direction control output line to the first reversible fan to set a rotation direction of the first reversible fan.

28. A method, comprising the steps of:

determining whether a first power supply module is communicatively coupled in a first position or a second position, wherein the first power supply module comprises a first reversible power supply fan;

setting a rotation direction of the first reversible power supply fan based on whether the first power supply module is in the first position or the second position, wherein a second power supply module is communicatively coupled in either the first or second position, wherein the second power supply module comprises a second reversible power supply fan; and driving the first and second reversible power supply fans in opposite rotation directions so the first and second reversible power supply fans generate airflow in a same direction.

29. The method of claim 28, wherein the first power supply module is communicatively coupled with a midplane board, wherein the step of determining whether the first power supply module is communicatively coupled in the first position or the second position comprises the step of:

determining whether the first power supply module is communicatively coupled with a first face of the midplane board in the first position or a second face of the midplane board in the second position.

30. The method of claim 28, wherein the step of setting the rotation direction of the first reversible power supply fan based on whether the first power supply module is in the first position or the second position comprises the steps of:

setting a clockwise rotation direction for the first reversible power supply fan if the first power supply module is in the first position; and setting a counterclockwise rotation direction for the first reversible power supply fan if the first power supply module is in the second position.

31. The method of claim 28, wherein the step of determining whether the first power supply module is communicatively coupled in the first position or the second position comprises the step of:

detecting an activation of a switch if the first power supply module is in the first position, wherein the switch is not activated if the first power supply module is in the second position.

32. The method of claim 28, wherein the first reversible power supply fan receives a signal over a direction control input line that controls the rotation direction of the first reversible power supply fan, wherein the step of setting the rotation direction of the first reversible power supply fan based on whether the first power supply module is in the first position or the second position comprises the steps of:

setting the direction control input line to be electrically high if the first power supply module is in the first position; and setting the direction control input line to be electrically low if the first power supply module is in the second position.

33. The method of claim 28, wherein the first reversible power supply fan receives signals over two input lines that control the rotation direction of the first reversible power supply fan, wherein the step of setting the rotation direction of the first reversible power supply fan based on whether the first power supply module is in the first position or the second position comprises the steps of:

setting a first line of the two input lines to be electrically high and a second line of the two input lines to be electrically low to drive the first reversible power supply fan in the clockwise direction if the first power supply module is in the first position; and setting the first line of the two input lines to be electrically low and the second line of the two input lines to be electrically high to drive the first reversible power supply fan in the counterclockwise direction if the first power supply module is in the second position.

34. An apparatus, comprising:

means for receiving a first power supply module on a first side of a midplane board and a second power supply module on a second side of the midplane board, wherein the first power supply module comprises a first fan and the second power supply module comprises a second fan, wherein a rotational direction of the second fan is reversible;

means for determining whether the second power supply module is communicatively coupled with the first side or the second side of the midplane board; and means for setting the rotational direction of the second fan to be opposite a rotational direction of the first fan to drive the second fan either in a clockwise direction or a counterclockwise direction based on whether the second power supply module is communicatively coupled with the first side or the second side of the midplane board so airflow through the second fan is in a same direction as airflow through the first fan.

35. The apparatus of claim 34, wherein the means for setting the rotational direction of the second fan comprises means for sending a rotation direction control signal to the second fan to set the rotation direction of the second fan.

36. The apparatus of claim 34, further comprising means for achieving substantially similar airflow characteristics in opposite airflow directions for both clockwise and counterclockwise rotation directions of the second fan.

* * * * *